(12) United States Patent
Jones, Jr. et al.

(10) Patent No.: US 6,790,727 B2
(45) Date of Patent: Sep. 14, 2004

(54) INTEGRATION OF TWO MEMORY TYPES ON THE SAME INTEGRATED CIRCUIT

(75) Inventors: Robert E. Jones, Jr., Austin, TX (US); Bruce E. White, Jr., Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 8 days.

(21) Appl. No.: 10/348,267

(22) Filed: Jan. 21, 2003

(65) Prior Publication Data

US 2003/0132500 A1 Jul. 17, 2003

Related U.S. Application Data

(62) Division of application No. 09/881,332, filed on Jun. 15, 2001, now Pat. No. 6,531,731.

(51) Int. Cl.[7] .............................................. H01L 21/336
(52) U.S. Cl. ........................ 438/257; 438/591; 438/981; 257/314; 257/315; 257/411
(58) Field of Search ................................. 438/257, 591, 438/260–261, 287–288, 593, 981; 257/410–411, 314–316

(56) References Cited

U.S. PATENT DOCUMENTS

| 5,894,146 A | | 4/1999 | Pio | |
|---|---|---|---|---|
| 6,060,743 A | * | 5/2000 | Sugiyama et al. | 257/321 |
| 6,083,791 A | * | 7/2000 | Bergemont | 438/258 |
| 6,146,948 A | * | 11/2000 | Wu et al. | 438/275 |
| 6,265,739 B1 | | 7/2001 | Yaegashi | |
| 6,300,193 B1 | | 10/2001 | Forbes | |
| 6,310,376 B1 | * | 10/2001 | Ueda et al. | 257/315 |
| 6,320,784 B1 | | 11/2001 | Muralidhar | |
| 6,351,411 B2 | | 2/2002 | Forbes | |
| 6,642,105 B2 | * | 11/2003 | Kim et al. | 438/257 |
| 2001/0016388 A1 | * | 8/2001 | Koyama et al. | 438/275 |

FOREIGN PATENT DOCUMENTS

| GB | 2054956 A | | 2/1981 | |
|---|---|---|---|---|
| JP | 10092957 A | * | 4/1998 | H01L/21/8247 |

OTHER PUBLICATIONS

Tiwari et al., "Technology and Power–Speed Trade–Offs in Quantum–dot and Nano–crystal Memory Devices," 1997 Symposium on VLSI Technology Digest of Technical Papers, pp. 133–134.

* cited by examiner

Primary Examiner—Jerome Jackson
Assistant Examiner—José R. Diaz
(74) Attorney, Agent, or Firm—James L. Clingan, Jr.

(57) ABSTRACT

Both a non-volatile memory (NVM) and a dynamic nanocrystal memory (DNM) are integrated on a semiconductor substrate. Control gates and control dielectrics with embedded nanocrystals or discrete storage elements are formed over differing thicknesses of tunnel dielectrics to form the two memories. Source and drain regions are formed within the semiconductor substrate adjacent to the tunnel dielectrics. Various methods can be used to form a thin tunnel oxide and a thick tunnel oxide by adding minimum processing steps.

7 Claims, 4 Drawing Sheets

INTEGRATION OF TWO MEMORY TYPES ON THE SAME INTEGRATED CIRCUIT

This is divisional U.S. patent application Ser. No. 09/881,332, filed on Jun. 15, 2001 now U.S. Pat. No. 6,531,731 which is hereby incorporated by reference, and priority thereto for common subject matter is hereby claimed.

FIELD OF THE INVENTION

This invention relates to memories and more particularly to integrated circuits utilizing two different kinds of memories.

RELATED ART

Many integrated circuits have the capability of performing a variety of different functions to achieve a particular objective. Common in this regard is a microcomputer having memory on board. In this regard it is often desirable for there to be memory which is nonvolatile so that when the power is turned off, some of the aspects that have been programmed are still present when the power is applied again. This is common in a variety of applications including portable and automotive applications. In addition to this desire for nonvolatile memory is the desire for high speed memory. Generally, these two requirements are in conflict in that the memory types that are most practical for this purpose are made differently. There is the nonvolatile memory (NVM) that has the capability of retaining the content that was programmed into the memory for long periods of time; for example 10 years. NVMs, however, are relatively slow in terms of their ability to be written. Other kinds of memory which are relatively fast, such as DRAMS, are not nonvolatile. DRAMS are advantageous because of their small size. SRAMS are desirable for certain specific applications because they are very fast but they occupy large amounts of space on the integrated circuit. For functionality it would be desirable to have DRAM and NVM on the same device. There may be SRAM as well for the specific applications that require the very highest speed. One of the difficulties in having DRAMS and nonvolatile memories on the same integrated circuit is that the processing required for the DRAMS is very different from that of nonvolatile memories. DRAMS include, as a primary component, a capacitor. This capacitor requires unique processing that is different from anything that is involved with the NVM. The result has been that it has been very uneconomical to have both DRAM and NVM on the same device.

The reason that this has been uneconomical is that there are many masking steps that are added by adding the DRAM capability to the NVM process. In addition to requiring both the processes for nonvolatile memory and DRAM, processes for logic devices also are required. The processing for the DRAM and the nonvolatile memory both add significant masking steps to the standard logic process. Nearly all of the added steps for NVM are different than those added for DRAM. So the combination of DRAM and nonvolatile memory added so many additional steps that the cost of processing and the difficulty of maintaining high yield made it uneconomical.

Thus it is seen there is a need for reducing the cost in having nonvolatile memory and high speed, high density memory in the same integrated circuit.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DESCRIPTION OF THE INVENTION

The ability to have high density, high speed memory and nonvolatile memory (NVM) on the same integrated circuit is achieved by utilizing the characteristic of a certain type of nonvolatile memory structure that can be made to operate much like a DRAM. This is used in combination with a NVM, which has normal NVM operating and retention characteristics, with minimal changes in the processing required to achieve both types of memories. Thus, the additional amount of processing required to achieve both types is very small. The high speed, high density memory uses a very reduced tunnel dielectric thickness between the substrate and the storage elements. The storage elements are nanocrystals which in combination with the very thin tunnel dielectric result in high speed operation.

Figure 1:
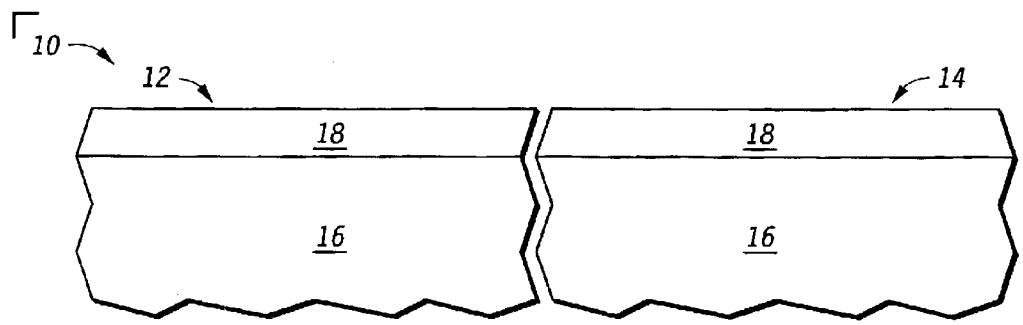
FIGS. 1–9 show sequential cross sections of an integrated circuit according to a preferred embodiment of the invention.

Shown in FIG. 1 is an integrated circuit 10 having a nonvolatile memory (NVM) region 12 and a dynamic nanocrystal memory (DNM) region 14. Integrated circuit 10 comprises a substrate 16 and at this stage in processing a dielectric 18. Dielectric 18 is preferably silicon oxide of a thickness of about 30–35 angstroms. This is a grown oxide of very high quality. Substrate 16 is preferably silicon but could be another semiconductor material. Also, underlying substrate 16 could be an insulating layer that is commonly used in the substrates known as silicon on insulator (SOI). Dielectric 18 may be other materials as well and may be selected from one of the high-k dielectrics such as hafnium oxide. The dielectric 18 is a material chosen for low leakage between a collection of nanocrystals, which operate as charge storage elements over the dielectric, and substrate 16.

Figure 2:
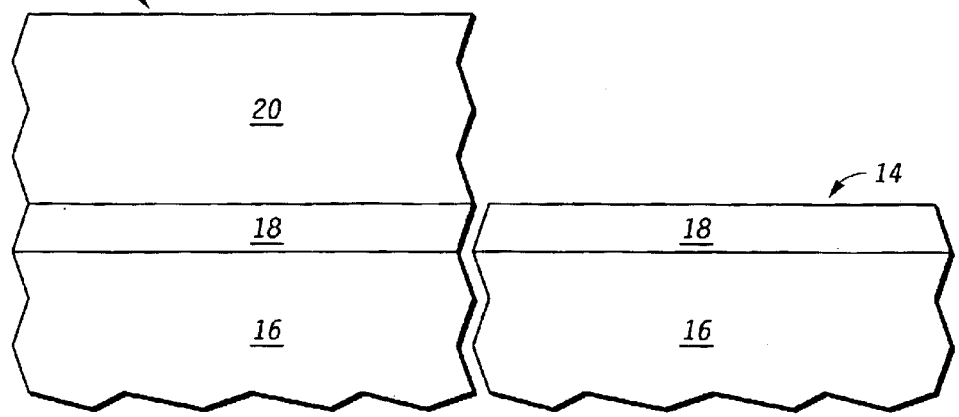
Figure 3:
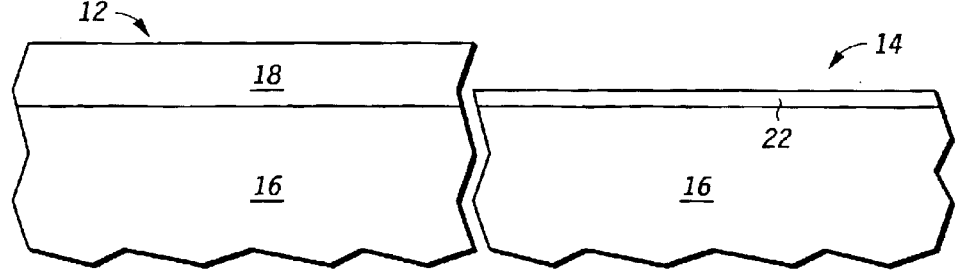

Shown in FIG. 2 is a patterned photoresist layer 20 over NVM region 12. With patterned photoresist 20 present over NVM region 12 but not present over DNM region 14, the portion of dielectric 18 over DNM region 14 is removed. Photoresist 20 is removed and a dielectric layer is grown in DNM region 14 to form dielectric 22. Dielectric 22 is chosen to be a thickness and material that provides for high speed of transfer of charge to and from storage elements present on top of it. Dielectric 22 is preferably a grown oxide of a thickness of approximately 15 angstroms. This material, however, could be another material chosen for the desired characteristic of high speed of charge transfer. In the case of dielectric 22 being grown oxide, dielectric layer 18 is also increased in thickness so that its thickness is about 35–40 angstroms. The growth rate for dielectric 22 is faster than it is for the additional thickening of dielectric 18 because dielectric 18 already had a thickness that the reacting material must travel through. In the case where dielectric 22 is different than dielectric 18, then dielectric 18 would be grown to its full thickness prior to performing patterned photoresist 20. Then dielectric 22 would be formed without adding to dielectric 18. As another alternative, dielectric 18 could be a composite of the initially formed material on which is added the material formed during the formation of dielectric 22.

There are other alternatives to achieving the relative thicknesses of dielectrics 18 and 22. The thinner dielectric 22 can be achieved by implanting nitrogen into region 14 but not region 12 prior to growth of oxide so that dielectric 22 grows more slowly than dielectric 18. The result is that dielectric 22 is thinner than dielectric 18. Similarly, fluorine can be implanted into region 12 but not region 14 prior to growth of oxide so that dielectric 18 grows faster than dielectric 22. The result then is also that dielectric 22 is thinner than dielectric 18.

Figure 4:
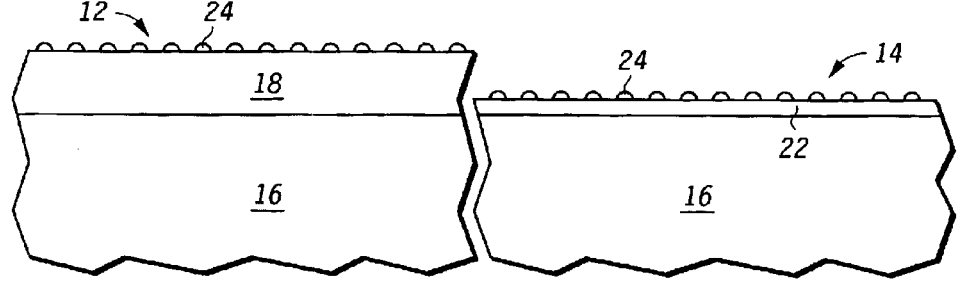

Shown in FIG. 4 is integrated circuit 10 after formation of nanocrystals 24 over dielectrics 18 and 22. Nanocrystals 24 are about 50 angstroms in height and shaped as hemispheres. They are preferably formed of monocrystalline silicon. In this case these nanocrystals are not shown to scale in the vertical dimension. In actuality the thickness of dielectric 18 is roughly the same as the height of the nanocrystals 24. However, in the horizontal dimension, in order to be able to ultimately show a transistor with multiple nanocrystals the dimensions have been intentionally reduced in the drawing.

Figure 5:
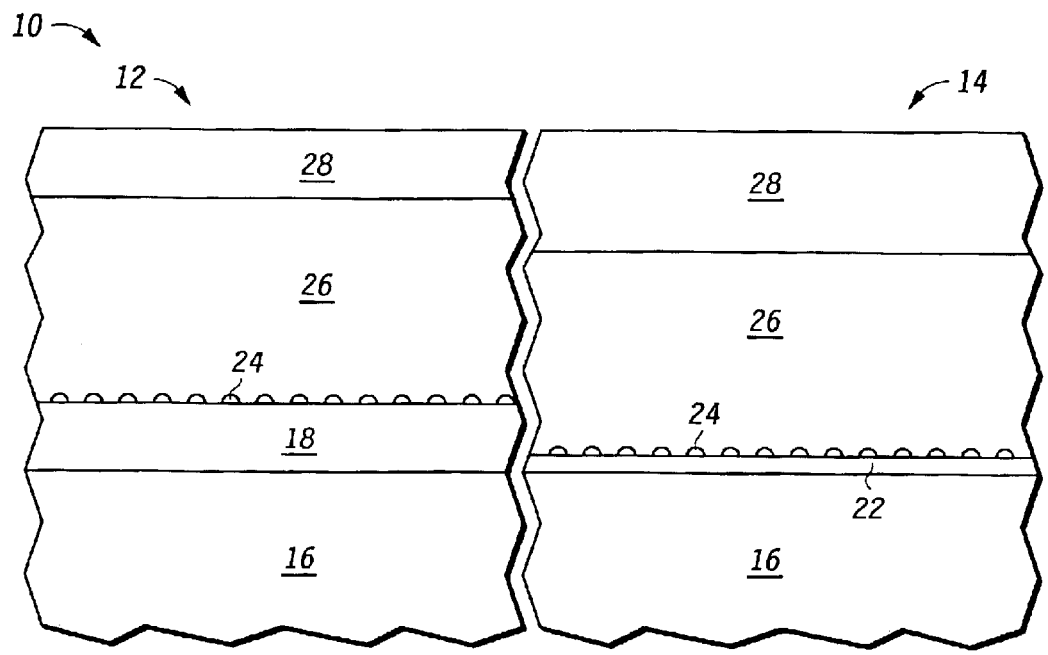

After formation of nanocrystals 24, a dielectric 26 is formed over nanocrystals 24 as shown in FIG. 5. Also, a gate conductor 28 is formed over dielectric 26. The thickness of gate electrode 28 is not drawn to scale. Its thickness is on the order of 1500 angstroms. The thickness of dielectric 26 is approximately 100 angstroms. Dielectric 26 is preferably a composite layer of oxide, nitride and oxide (ONO). Other alternatives could also be used. The desire is for it to be a very low leakage, high quality film with a sufficiently high degree of coupling between conductor 28 and substrate 16. Dielectric 26, however, is not intended to pass charge.

Figure 6:
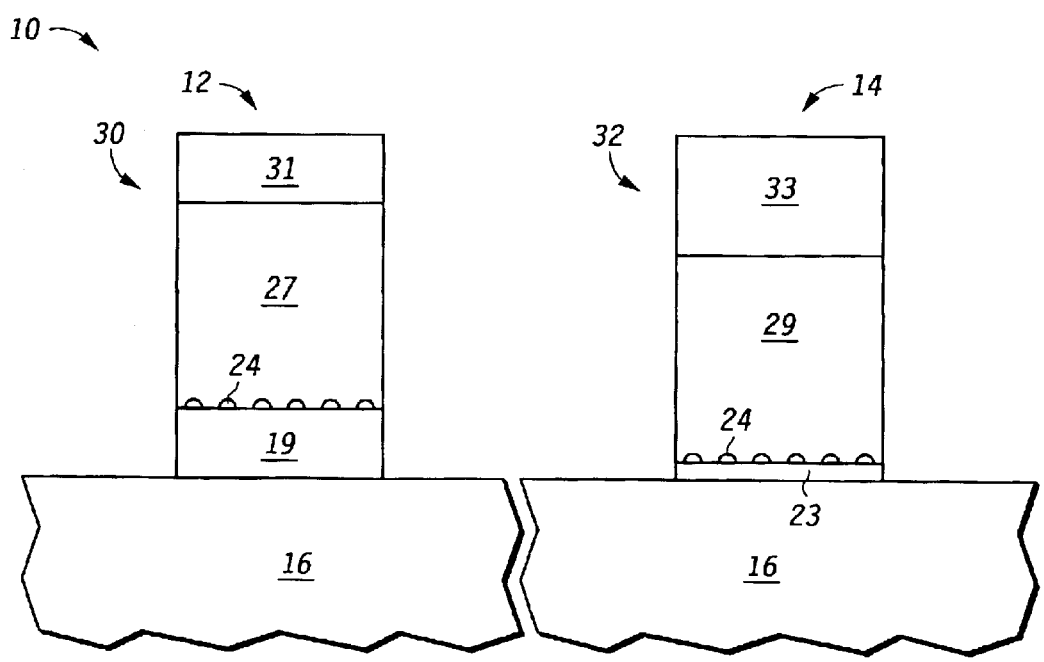

Conductor 28, dielectric 26 and dielectrics 18 and 22 as well as nanocrystals 24 are etched to form gate structures 30 and 32. Gate structure 30 comprises a tunnel dielectric 19 formed of a portion of dielectric 18, nanocrystals 24 above tunnel dielectric 19, a control dielectric 27 formed of a portion of dielectric 26, and a control gate 31 formed of a portion of conductor 28. Similarly, gate structure 32 comprises a tunnel dielectric 23 formed of a portion of dielectric 22, nanocrystals 24 above tunnel dielectric 23, a control dielectric 29 formed of a portion of dielectric 26, and a control gate 33 formed of a portion of conductor 28. This etch process begins by etching conductor 28 down to dielectric 26. After this there are several available techniques for removing the remainder of dielectric 26, nanocrystals 24, dielectric 18 and dielectric 22 according to the desired gate pattern. One way is to etch nearly all of dielectric 26 to at least expose nanocrystals 24, then etch nanocrystals 24, and then complete the etch of dielectric 18 and 22. Another alternative is to etch dielectric 26 to the point where the nanocrystals are at least partially exposed, then oxidizing the nanocrystals. After the nanocrystals are oxidized, the etch is resumed using etching materials that are effective in removing dielectric 18 as well as removing oxidized nanocrystals. In the preferred case dielectric 18 and dielectric 22 are both oxide so the etchant will be very effective in both etching oxidized nanocrystals and the dielectric 18. The etching materials are highly selective between oxide and silicon. The drawing may make it appear that it is difficult to achieve such precision in the depth of the etch, but in actuality, because the drawing is not to scale, the nanocrystals are much higher than would appear in FIG. 6. Thus, it does not require a precision etch depth to expose the nanocrystals.

Figure 7:
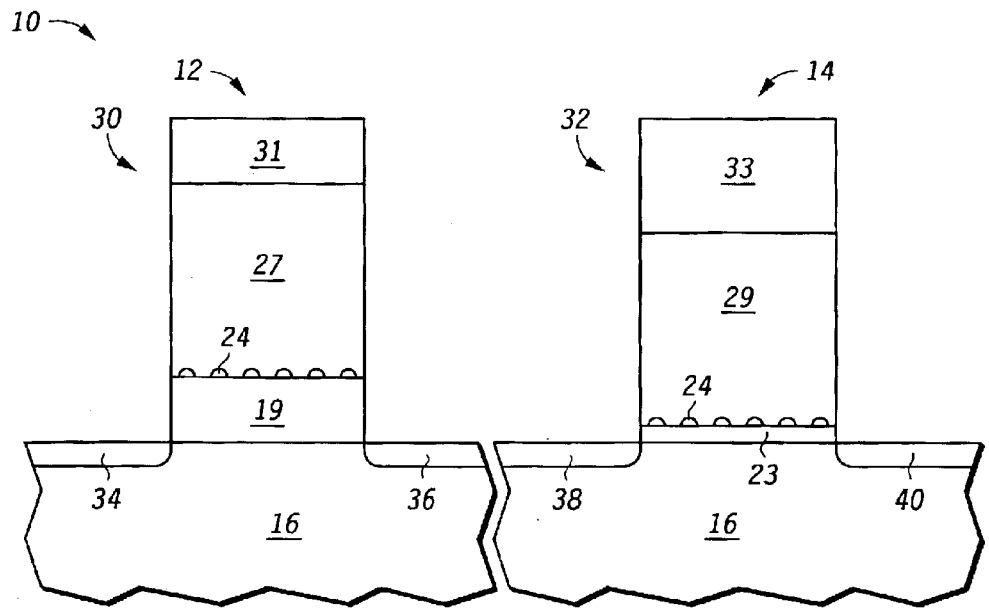

Shown in FIG. 7 is a formation of source/drain extensions. Source/drain extensions 34 and 36 are implanted using gate structure 30 as a mask. Similarly, source/drain extensions 38 and 40 are formed using gate structure 32 as a mask. In this example, NVM region 12 and DNM region 14 are doped and implanted during the same step. They could be implanted in different steps which would require an additional masking step. So in the case where they are implanted together, regions 34–40 would be the same conductivity type. Typically, this would be N-type, but could be P type. In an alternative embodiment, NVM region 12 could be N-channel and DNM region 14 could be P-channel. In such case, regions 34 and 36 would be N-type and regions 38 and 40 would be P-type. Regions 38 and 40 would be implanted at a different time than regions 34 and 36. Similarly, as another alternative, NVM region 12 could be P-channel and DNM region 14 could be N-channel. In each case, the doping of regions 34–40 is a relatively light doping.

Figure 8:
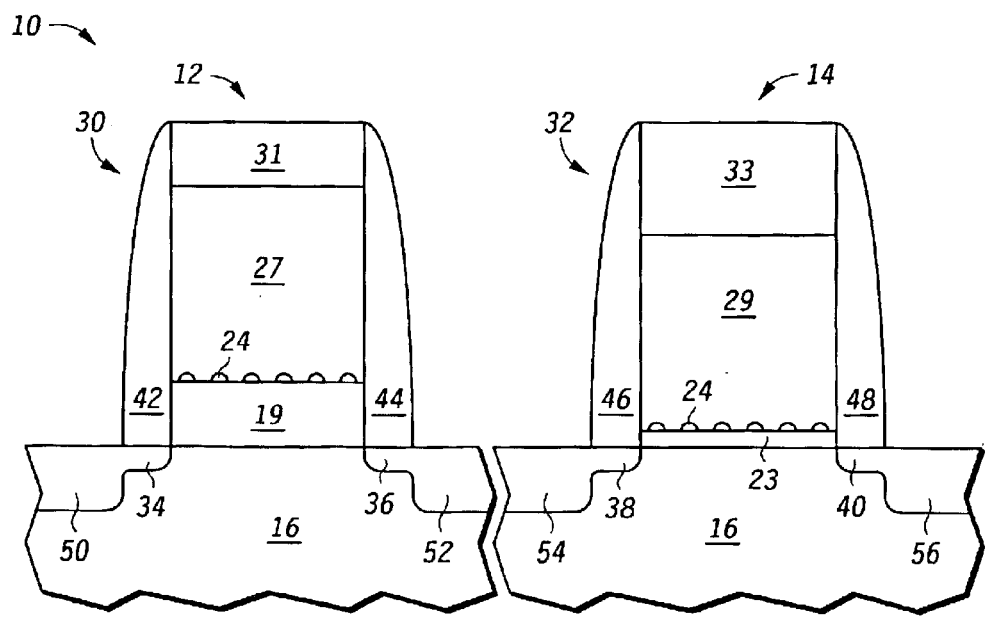

Subsequently as shown in FIG. 8, sidewall spacers 42 and 44 are formed around gate structure 30, and sidewall regions 46 and 48 are formed around gate structure 32. Sidewall spacers 42–48 are used as masks for the relatively heavy subsequent implanting of source/drain regions 50–56. Again, in one embodiment where regions 34–40 are the same conductivity type, regions the implant using sidewall spacers 42–48 as a mask occurs at the same time. This results in the formation of regions 50, 52, 54 and 56 in substrate 16. Regions 50, 52, 54 and 56 are of a relatively heavier doping level than regions 34, 36, 38 and 40. If the transistors in DNM region 14 are to be of a different type than the transistors in NVM region 12, then regions 54 and 56 would be formed at a different time than regions 50 and 52. Region 12 would be masked off during the implanting of region 14. Similarly, during the implanting of region 12, region 14 would be masked off.

Figure 9:
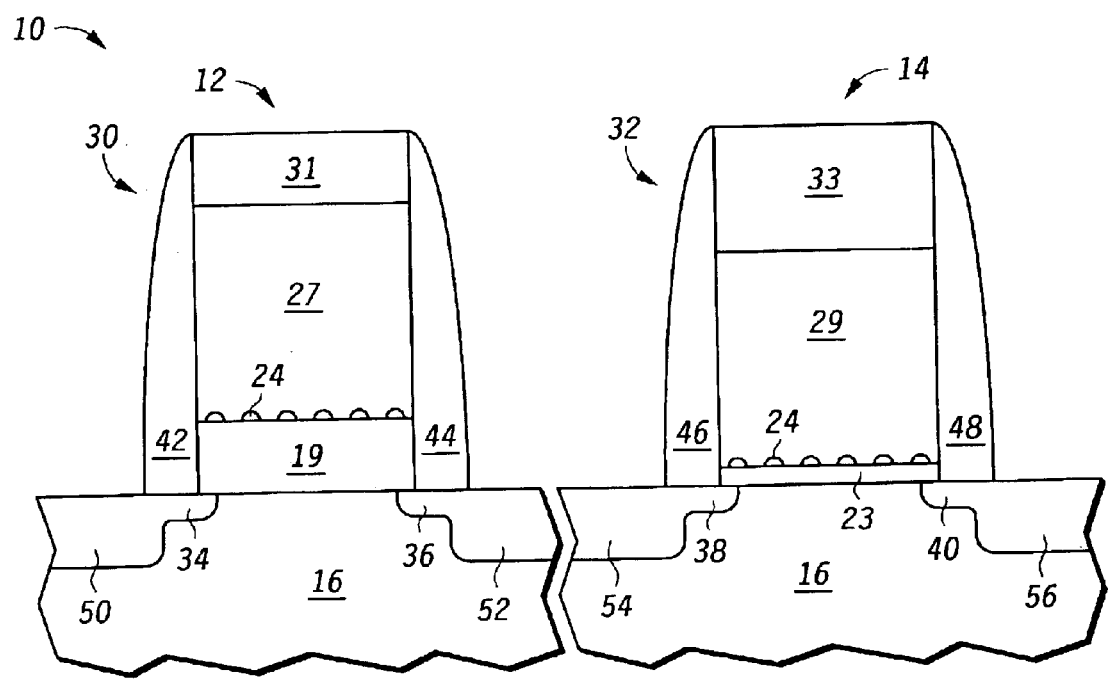

After implanting regions 50–56, there will be substantial additional processing including annealing to activate the implanted dopants in regions 34–40 and 50–56. The resulting structure of a transistor, which is a non-volatile memory cell, in region 12 and a transistor, which is a dynamic nanocrystal memory cell, in region 14 are shown in FIG. 9. This shows the diffusion of regions 34–40 into areas under gate structure 30 and gate structure 32. Control gates 31 and 33 are the same thickness. The drawings show them as being a different thickness but the purpose of the drawing is to show that the ultimate height is virtually identical between the two transistor gate structures and to show the relative dielectric thicknesses that underlie the gate conductors 31 and 33. As another example of the drawings not being to scale, the thickness of tunnel dielectric 23 in relation to the source/drain separation is greatly exaggerated in the drawings but is not unusual for drawings depicting transistors in cross section.

This process described in FIGS. 1–9 is a very efficient process for making both NVMs using nanocrystals and a memory that is high speed and high density. This is achieved using only one additional mask to that required for making the NVM. With the relatively thin tunnel dielectric for the DNM, the write speeds are comparable to those of a DRAM. With the very thin tunnel dielectric, leakage is relatively high so that a DNM is not considered useful as a nonvolatile memory. However, its leakage rate is much lower than that of a DRAM. Thus, the DNM does require refresh but not nearly at the frequency of a DRAM. A DRAM, for example, will lose its charge in the order of milliseconds if it is not refreshed, whereas the DNM will take on the order of hours or even days to lose its charge. The DNM is actually a higher density than that of a DRAM. The DRAM requires a transistor and a capacitor, whereas the DNM provides storage capability in a single transistor stack. The desired result of having both nonvolatile memory and high speed, high density memory on only a single integrated circuit is thus achieved with minimal, if any, additional cost over having just one of nonvolatile memory or high speed, high density memory.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. The method of making a semiconductor device comprising:

providing a semiconductor substrate;

forming a thin dielectric layer over a first portion of the semiconductor substrate;

forming a thick dielectric layer over a second portion of the semiconductor substrate, wherein the thick dielectric layer is thicker than the thin dielectric layer; and forming a plurality of discrete storage elements over at least a portion of the thin dielectric layer and at least a portion of the thick dielectric layer.

2. The method of claim 1, wherein forming the thin dielectric layer and the thick dielectric layer is performed by thermal growth.

3. The method of claim 1, further comprising:

forming a first dielectric layer;

patterning a photoresist layer to expose a first portion of the first dielectric layer and mask a second portion of the first dielectric layer;

removing the first portion of the first dielectric layer to expose a portion of the semiconductor substrate, removing the photoresist layer;

forming a second dielectric layer over the second portion of the first dielectric layer, wherein the second dielectric layer and the second portion of the first dielectric layer form the thick dielectric layer; and forming the thin dielectric layer over the portion of the semiconductor substrate while forming the second dielectric layer.

4. The method of claim 3, wherein forming the thin dielectric layer and forming the second dielectric layer are performed by thermal growth.

5. The method of claim 1, further comprising:

forming a patterned photoresist layer to expose a first portion of the semiconductor substrate;

implanting nitrogen into the first portion of the semiconductor substrate;

removing the patterned photoresist layer;

thermally growing the thin dielectric layer over the first portion of the semiconductor substrate; and thermally growing the thick dielectric layer over a second portion of the semiconductor substrate while thermally growing the thin dielectric layer.

6. The method of claim 1, further comprising:

forming a patterned photoresist layer to expose a second portion of the semiconductor substrate;

implanting fluorine into the second portion of the semiconductor substrate;

removing the patterned photoresist layer;

thermally growing the thick dielectric layer over the second portion of the semiconductor substrate; and thermally growing the thin dielectric layer over a first portion of the semiconductor substrate while thermally growing the thick dielectric layer.

7. The method of claim 1, further comprising:

forming a control dielectric over the plurality of discrete storage elements;

forming a control gate over the control dielectric;

forming a first source region and a first drain region adjacent the thin dielectric layer; and forming a second source region and a second drain region adjacent the thick dielectric layer.

* * * * *